United States Patent
Van der Plas et al.

(10) Patent No.: US 9,411,000 B2
(45) Date of Patent: Aug. 9, 2016

(54) METHOD AND SYSTEM FOR MEASURING CAPACITANCE DIFFERENCE BETWEEN CAPACITIVE ELEMENTS

(71) Applicants: IMEC, Leuven (BE); Sony Corporation, Tokyo (JP)

(72) Inventors: Geert Van der Plas, Leuven (BE); Ken Sawada, Tokyo (JP); Yuichi Miyamori, Tokyo (JP); Ankur Anchlia, Indore (IN); Abdelkarim Mercha, Brussels (BE)

(73) Assignees: IMEC, Leuven (BE); Sony Corporation, Tokyo (JP)

( * ) Notice: Subject to any disclaimer, the term of this patent is extended or adjusted under 35 U.S.C. 154(b) by 43 days.

(21) Appl. No.: 14/311,084

(22) Filed: Jun. 20, 2014

(65) Prior Publication Data
US 2014/0372057 A1 Dec. 18, 2014

Related U.S. Application Data

(63) Continuation of application No. PCT/EP2012/062652, filed on Jun. 28, 2012.

(30) Foreign Application Priority Data

Dec. 23, 2011 (EP) .................................... 11195723

(51) Int. Cl.
*G01R 27/00* (2006.01)
*G01R 27/26* (2006.01)
(Continued)

(52) U.S. Cl.
CPC ............ *G01R 27/2605* (2013.01); *G01B 7/003* (2013.01); *G01R 31/2853* (2013.01)

(58) Field of Classification Search
CPC ..... G06F 3/044; G01R 27/2605; H01L 28/40; G01D 5/24
See application file for complete search history.

(56) References Cited

U.S. PATENT DOCUMENTS

| | | | |
|---|---|---|---|
| 4,054,833 A | 10/1977 | Briefer | |
| 4,187,459 A | 2/1980 | Wolfendale | |

(Continued)

FOREIGN PATENT DOCUMENTS

| | | |
|---|---|---|
| EP | 2014227 | 1/2009 |
| WO | WO 2013/091909 | 6/2013 |

OTHER PUBLICATIONS

International Search Report and Written Opinion, dated Nov. 27, 2012 in Int'l App. No. PCT/EP2012/062652.

(Continued)

*Primary Examiner* — Elias Desta
(74) *Attorney, Agent, or Firm* — Knobbe, Martens, Olson & Bear, LLP (57) ABSTRACT

Methods and systems for measuring capacitance difference are disclosed. In one aspect, first and second capacitive elements are connected between voltage receiving nodes for receiving first and second DC voltages and nodes connectable to a third DC voltage via a first, resp. second switch. Further, in a first phase, a voltage difference is applied to charge the capacitive elements and the switches are alternately closed. First resulting currents are measured. Further, in a second phase, the first and second DC voltages are applied alternatingly and the switches are alternately closed. Second resulting currents are measured. The capacitance difference can be determined from the first and second resulting currents.

21 Claims, 9 Drawing Sheets

(51) Int. Cl.
*G01B 7/00* (2006.01)
*G01R 31/28* (2006.01)

(56) References Cited

U.S. PATENT DOCUMENTS

| | | | |
|---|---|---|---|
| 4,797,603 A | | 1/1989 | Choisnet |
| 5,353,656 A | | 10/1994 | Hawkey et al. |
| 6,838,869 B1 | * | 1/2005 | Rogers ............... G01R 27/2605 257/48 |
| 7,129,712 B1 | | 10/2006 | Drost et al. |
| 2003/0071641 A1 | | 4/2003 | Armbruster |
| 2006/0284603 A1 | | 12/2006 | Nehrig et al. |

OTHER PUBLICATIONS

Chang et al., A Novel Simple CBCM Method Free From Charge Injection-Induced Errors, IEEE Electron Device Letters, vol. 25, No. 5, May 2004, pp. 262-264.

Chen et al., An On-Chip, Attofarad Interconnect Charge-Based Capacitance Measurement (CBCM) Technique, IEEE, 1996, pp. 69-72.

Heidary et al., Features and Design Constraints for an Optimized SC Front-End Circuit for Capacitive Sensors With a Wide Dynamic Range, IEEE Journal of Solid-State Circuits, vol. 43, No. 7, Jul. 2008, pp. 1609-1616.

Kung et al., A Digital Readout Technique for Capacitive Sensor Applications, IEEE Journal of Solid-State Circuits, vol. 23, No. 4, Aug. 1988, pp. 972-977.

Malcovati et al., Interface Circuitry and Microsystems, MEMS: A Practical Guide To Design, Analysis, and Applications, 2005, Chapter 17, pp. 901-942.

Pennisi, High-Performance and Simple CMOS Interface Circuit for Differential Capacitive Sensors, IEEE Transactions on Circuits and Systems—II; Express Briefs, vol. 52, No. 6, Jun. 2005, pp. 327-330.

Seeger et al., Dynamics and Control of Parallel-Plate Actuators Beyond the Electrostatic Instability, Transducers '99, The 10th International Conference on Solid-State Sensors and Actuators, Jun. 7-9, 1999, pp. 474-477.

Sylvester et al., Investigation of Interconnect Capacitance Characterization using Charge-Based Capacitance Measurement (CBCM) Technique and 3-D Simulation, IEEE, 1997, pp. 491-494.

Sylvester et al., Investigation of Interconnect Capacitance Characterization Using Charge-Based Capacitance Measurement (CBCm) Technique and Three-Dimensional Simulation, IEEE Journal of Solid-State Circuits, vol. 33, No. 3, Mar. 1998, pp. 449-453.

Wang et al, High-Accuracy Circuits for On-Chip Capacitive Ratio Testing and Sensor Readout, IEEE Transactions on Instrumentation and Measurement, vol. 47, No. 1, Feb. 1998, pp. 16-20.

* cited by examiner

FIG. 9

METHOD AND SYSTEM FOR MEASURING CAPACITANCE DIFFERENCE BETWEEN CAPACITIVE ELEMENTS

CROSS REFERENCE TO RELATED APPLICATIONS

This application is a continuation of PCT Application No. PCT/EP2012/062652, filed Jun. 28, 2012, which claims the benefit of European Application No. EP 11195723.9, filed Dec. 23, 2011. Each of the above applications is hereby incorporated by reference in its entirety.

BACKGROUND

1. Technological Field

The present disclosure relates to a method and system for measuring a capacitance difference between capacitive elements.

2. Description of the Related Technology

Measuring capacitance is used in many test structures to assess technology performance. However the scaling of technology has resulted in a reduction of capacitance values that are of practical use in circuits. Current methods to assess the matching of capacitance are not adequate to measure accurately the difference of very small capacitances (100 fF and well below) that are relevant for circuit design.

For example, a charge based capacitance measurement method is known from Dennis Sylvester et al., "Investigation of Interconnect Capacitance Characterization Using Charge-Based Capacitance Measurement (CBCM) Technique and Three-Dimensional Simulation," IEEE JSSC 1998. This method is capable of measuring absolute capacitance of a capacitor, but its accuracy is insufficient.

SUMMARY OF CERTAIN INVENTIVE ASPECTS

It is an aim of the present disclosure to provide a method and system for more accurately measuring a capacitance difference between capacitive elements.

This aim is achieved according to the disclosure with the method and system of the independent claims.

According to the disclosure, a capacitance difference between a first capacitive element and a second capacitive element is measured as follows. Use is made of a first DC voltage, a second DC voltage which is different from the first DC voltage, and a third DC voltage (for example the ground level). The first capacitive element is connected between a first node and a second node, the second node being connectable to the third DC voltage via a first switch. The second capacitive element is connected between a third node and a fourth node, the fourth node being connectable to the third DC voltage via a second switch, which is matched to the first switch for symmetry reasons, and the second and fourth nodes being connectable to each other (e.g. directly connected to each other or connectable by a further switch). In a first phase of the measurement, the first DC voltage is applied to the first node and the second DC voltage is applied to the third node, to charge the capacitive elements, and the first and second switches are alternately closed by means of non-overlapping clock signals. First resulting currents flowing through at least one of the first and second switches are measured (preferably through both for improved accuracy, though this is not essential). In a second phase of the measurement, the first and second DC voltages are applied alternatingly to the first and third nodes, for alternatingly charging and discharging the capacitive elements, and the first and second switches are alternately closed by means of the non-overlapping clock signals at such instances that said alternations of the first and second DC voltages occur while either the first switch or the second switch is closed. Second resulting currents flowing through at least one of the first and second switches are measured (preferably through both, though this is not essential). The capacitance difference can be determined from the first and second resulting currents measured during respectively the first phase and the second phase.

According to the disclosure, accuracy is firstly achieved by the symmetry of the measurement setup: the alternating differential voltage ensures that the voltages on the first and third nodes are matched to each other; and the matched switches ensure that the parasitic influence of these switches can be correctly cancelled out.

According to the disclosure, the accuracy is further achieved by the separate measurements of the capacitance of the circuit (first phase) and the capacitance of the circuit together with the capacitance difference (second phase). As a result, the capacitance difference can be simply determined from a subtraction of the currents measured during the first and second phases.

In an embodiment, the first and second DC voltages are applied alternatingly to the first and third nodes by alternately connecting them to a first DC voltage supply which supplies the first DC voltage and a second DC voltage supply which supplies the second DC voltage. In an example, the first DC voltage supply can be the Vdd of a chip and the second DC voltage supply can be the ground level. In this way, the need for two separate matched voltage supplies for generating the first and second voltages can be avoided.

In an embodiment, the first and second currents are measured by means of a transimpedance amplifier or an integrator circuit. Such measurement means are suitable examples for an on chip implementation of the method/system of the disclosure, though not the only examples.

In an embodiment, the alternating of the first and second DC voltages is performed by complementary clock signals having a duty cycle of 50% and the non-overlapping clock signals for operating the first and second switches have a duty cycle of less than 50%. Preferably, the non-overlapping clock signals have a duty cycle of more than 40% to maximize stabilization time for the signals.

In an embodiment, a first measurement is performed with the first, second and third DC voltages set to a first set of values and a second measurement is performed with the first, second and third DC voltages set to a second set of values different from the first set of values. This combination of measurements can for example be used for extracting a voltage dependent behavior of the first and/or second capacitive element.

In an embodiment, a first measurement is performed at a first frequency of the alternations and the non-overlapping clock signals and a second measurement is performed at a second frequency of the alternations and the non-overlapping clock signals, the second frequency being different from the first frequency. Measuring at different frequencies can enhance the accuracy of the measurement.

In another aspect, this disclosure relates to a method and system for measuring a position information between a first conducting material, a second conducting material and a third conducting material, wherein the first and second conducting materials form a first capacitive element and the second and third conducting materials form a second capacitive element. In a first step, a capacitance difference between the first capacitive element and the second capacitive element is measured by means of the method/system described herein. In a second step, position information is determined from the measured capacitance difference and material parameters of the first, second and third conducting materials.

BRIEF DESCRIPTION OF THE DRAWINGS

The disclosure will be further elucidated by means of the following description and the appended figures.

FIG. 7 shows (a) a side view and (b) a top view of a possible MEMS application.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising," used in the claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Figure 1:
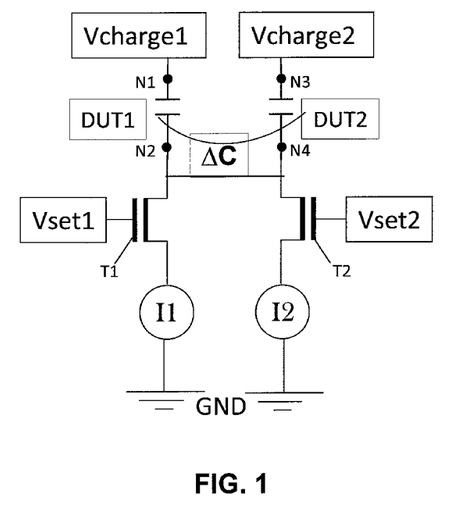
FIG. 1 shows a schematic representation of an embodiment of a test structure according to the disclosure.
Figure 2:
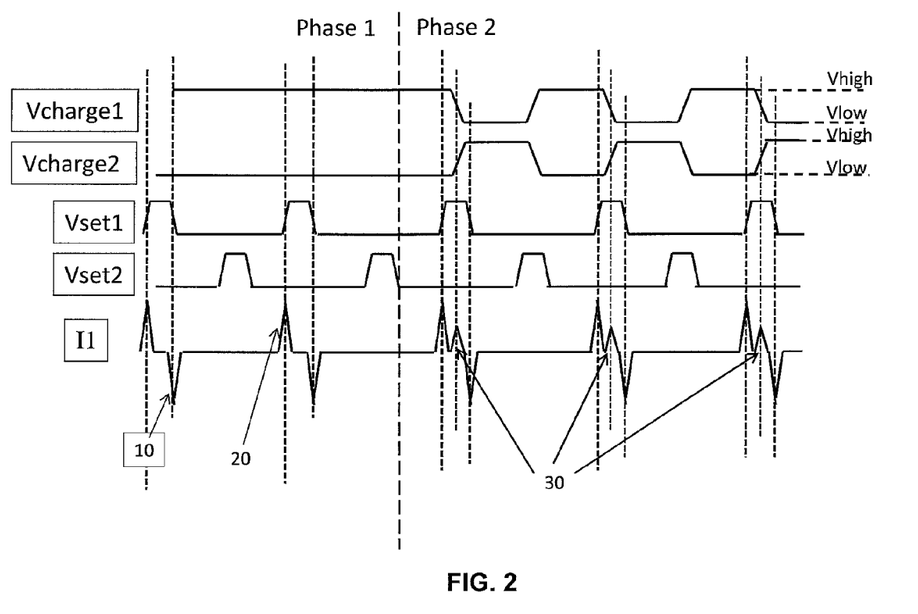
FIG. 2 shows the control and measurement of the test structure of FIG. 1.

The measurement method of the disclosure is generally explained by means of FIGS. 1 and 2, which show an example of a measurement set-up and applied signals according to the disclosure.

As shown in FIG. 1, the set-up comprises voltage supply means for supplying two different voltages, denoted "Vcharge1" and "Vcharge2," which are used for charging and discharging the capacitive elements. The set-up further comprises a first node N1 and a second node N2 between which the first capacitive element, generally denoted "device under test" 1, DUT1, is connectable; and a third node N3 and a fourth node N4 between which the second capacitive element, generally denoted "device under test" 2, DUT2, is connectable. The second node N2 is connectable to ground GND via a first switch T1, the ground level being an example of "the third DC voltage" defined herein. The fourth node N4 is connectable to ground via a second switch T2 which is matched to the first switch T1. The second and fourth nodes N2, N4 are shown to be directly connected to each other, but they may also be connectable to each other by means of for example a further switch. Current measurement means are provided for measuring currents I1, I2 flowing through the first and second switches T1, T2 in a first measurement phase and a second measurement phase. These currents I1, I2 can be evaluated in order to determine the capacitance difference.

The applied signals Vcharge1, Vcharge2 and Vset1, Vset2 are shown in FIG. 2. In the first measurement phase, a first DC voltage Vhigh is applied to the first node N1 and a second DC voltage Vlow is applied to the third node N3, to charge the capacitive elements DUT1, DUT2. The first and second switches T1, T2 are alternately closed by means of non-overlapping clock signals Vset1, Vset2 and first resulting currents (of which only I1 is shown), which flow through at least one of the first and second switches, are measured. As shown, the first resulting current I1 during the first phase comprises current peaks 10, 20 at the opening/closing of the first switch T1. In the second phase, the first and second DC voltages Vhigh, Vlow are applied alternatingly to the first and third nodes N1, N3, by varying the voltages applied by the voltage sources Vcharge1, Vcharge2 in a complementary way. As a result, the capacitive elements DUT1, DUT2 are alternately charged and discharged. The first and second switches T1, T2 are closed by means of the non-overlapping clock signals (Vset1, Vset2) in the same way as during the first phase, but the whole is now controlled such that the alternations of the first and second DC voltages Vhigh, Vlow occur while either the first switch or the second switch is closed. Second resulting currents I1, I2 flowing through at least one of the first and second switches T1, T2 are measured. As shown, the second resulting current I1 during the second phase comprises the current peaks 10, 20 at the opening/closing of the switch T1, i.e. substantially the same peaks as in the first phase, but also current peaks 30 which result from the alternating of the first and second voltages Vhigh, Vlow by means of the two voltage sources Vcharge1, Vcharge2.

The capacitance difference can be determined by subtracting the currents measured during the first phase from those measured during the second phase. The current peaks 30 are proportional to the capacitance difference as follows:

$$\Delta C = \frac{\Delta I}{\Delta V * f}$$

wherein

ΔI is the difference between the currents measured during the first phase and the second phase (i.e. the peaks 30);

ΔV is the voltage difference between Vhigh and Vlow;

f is the frequency of the non-overlapping clocks and the alternations.

The voltage supplies Vcharge1, Vcharge2 are matched. They are preferably selected with a sufficiently low output impedance to avoid affecting the measurement. More particularly, the impedance can be chosen such that the settling of the Vcharge nodes is much faster than the period of the measurement. This corresponds to Cvchargenode*Recharge<<period of the measurement (at least 10 times smaller). For a period of 10 ns (100 MHz) this is at most 1 ns, or for 10 pF parasitic less than 100 Ohm. Relaxing the frequency relaxes this impedance proportionally, The same is true when reducing the parasitic capacitance.

In alternative embodiments, a single voltage supply and switches for alternately connecting the first and third nodes to this single voltage supply and ground can also be used.

Another constraint for the set-up is that the relative matching between Vcharge1 and Vcharge2 is preferably better than the relative ΔC. For a 0.1% matching a 1V Vcharge swing is preferably accurate up to 1 mV.

Figure 3:
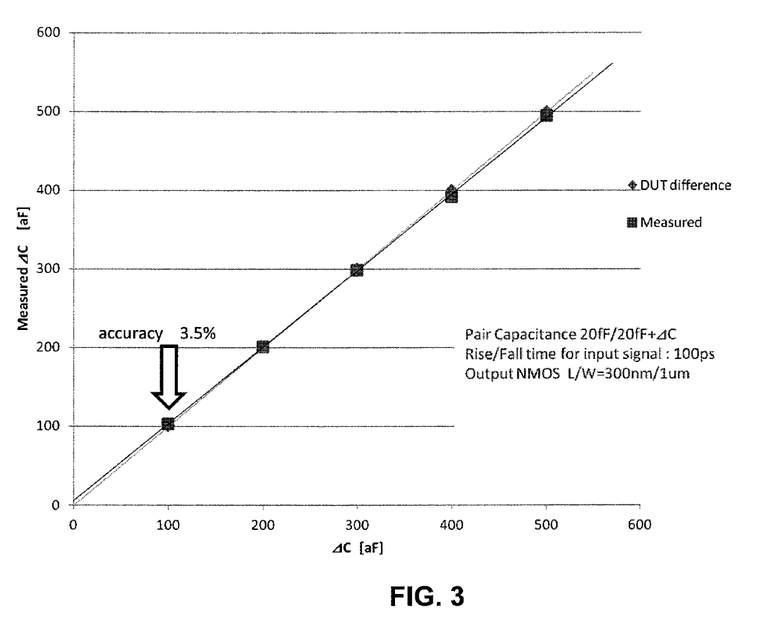
FIG. 3 shows measurement results from a first possible application of the method/system of the disclosure: to measure capacitance mismatch ΔC between two capacitive elements.

FIG. 3 shows measurement results from a first possible application of the method/system of the disclosure: to measure capacitance mismatch ΔC between two capacitive elements. In the example shown, DUT1=20 fF, DUT2=20 fF+ΔC, the rise/fall time for the input signal is 100 ps and the output NMOS switches T1 and T2 are sized L/W=300 nm/1 μm (note: the sizing depends on technology, in particular oxide thickness; here 0.18 μm type devices are used). Measured ΔC is set out vs. actual ΔC. For example, at ΔC=100 aF an accuracy of 3.5% is achieved. This shows the achievable accuracy with the method/system of the disclosure.

Figure 4:
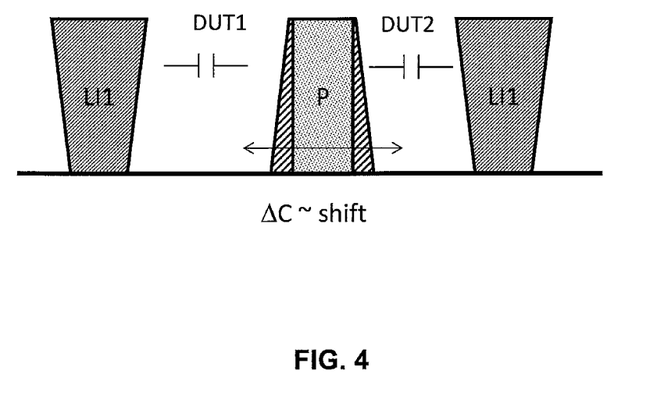
FIG. 4 shows a second possible application of the method/system of the disclosure: an alignment monitor.

FIG. 4 shows a second possible application of the method/system of the disclosure: an alignment monitor. Here, the fringing capacitance is measured between two parts of a local interconnect LI1 and a poly part P in between, to detect if the distance on either side of the poly P is the same or at a desired difference. The tapered part shown on either side of the poly P is a spacer, which results from processing, and the white space between the poly P and the local interconnect parts LI1 is a dielectric. Another example where this technique is useful is double patterning. The principle is each time the same, a capacitance difference measured between the fringing capacitance of one side vs. the other is proportional to a mismatch in the distances, which can be intentional or not.

Intentional mismatch can also be used for calibration purposes. For example, on the same wafer matched and intentionally (known) mismatched capacitances can be made to show the dependency of the capacitance versus the current. This calibration is achieved by taking the average of many samples. The averaging ensures that the intentional mismatch is found and not the random mismatch of a single sample.

The switches T1, T2 of the measurement set-up of FIG. 1 are selected of an appropriate size with respect to expected capacitance of the capacitive elements DUT1, DUT2. An appropriate size can be determined by simulation. Table 1 below gives an overview of some appropriate values.

TABLE 1

| Capacitance | Driver Gate Length | Driver Gate Width |
|---|---|---|
| 10 fF | 250 nm | 0.5 μm |
| 20 fF | 250 nm | 1 μm |
| 50 fF | 250 nm | 2.5 μm |
| 100 fF | 250 nm | 5 μm |
| 200 fF | 250 nm | 10 μm |

Figure 5:
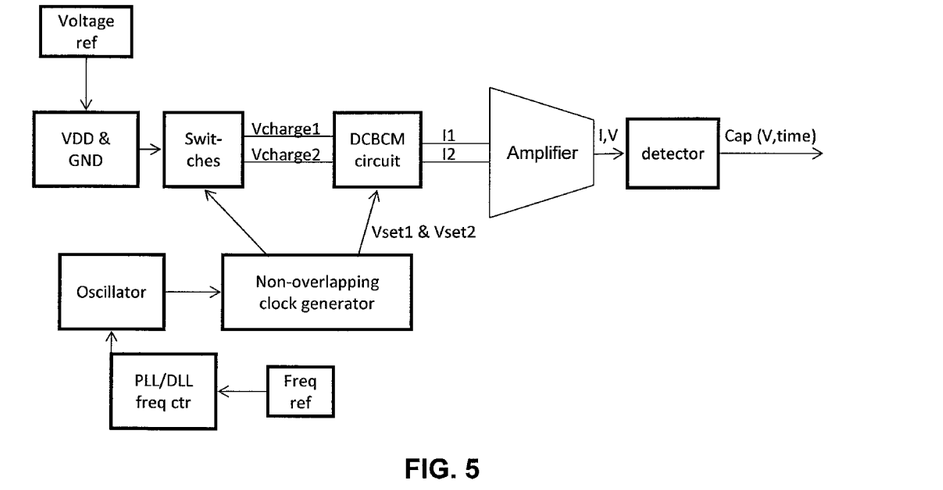
FIG. 5 shows an embodiment of an on-chip capacitance monitoring system.

FIG. 5 shows an embodiment of an on-chip capacitance monitoring system, which can for example be used to monitor the relative positions of two MEMS elements with respect to a reference (see e.g. FIG. 7 described below). A reference voltage is used to generate the first and second DC voltages Vhigh and Vlow, here Vdd and GND. These are applied via a switching block to a difference charge-based capacitance measurement (DCBCM) block according to the disclosure. A clock generator generates the signals for the alternate switching between Vdd and GND at the input nodes N1, N3 of the DCBCM block and the non-overlapping clock signals for controlling the switches T1, T2 in this block. The resulting measured currents I1, I2 are amplified by an amplifier, for example a TIA, and the amplified signal is fed to a detector for evaluation. The detector outputs a voltage representative of the measured capacitance difference.

The clock generator has as reference input an oscillator which can be set at a suitable frequency (e.g. 10-100 MHz) by means of a reference frequency and a phase locked loop. In an embodiment, the frequency can be changed to effect measurements at different frequencies and further enhance the accuracy. The duty cycle of the non-overlapping clock signals for the switches T1, T2 is smaller than the duty cycle (50%) of the Vcharge1, Vcharge2 voltages, e.g. 48%.

The clock generator can be delay-based, i.e. applying fixed delays to obtain the four different switching signals.

The clock generator can also be divider based, i.e. applying a fixed duty cycle to obtain the four different switching signals.

The Vcharge1, Vcharge2 voltages can for example be: +1/0 V or +1/−1 V. In an embodiment, different voltages can be applied to obtain a voltage dependent behavior of the capacitive elements.

The system shown in FIG. 5 is an example and not the only solution. For example, instead of a TIA also an integrator circuit can be used. The detector can also output a time (when the capacitance difference reaches a certain value), etc.

Figure 6:
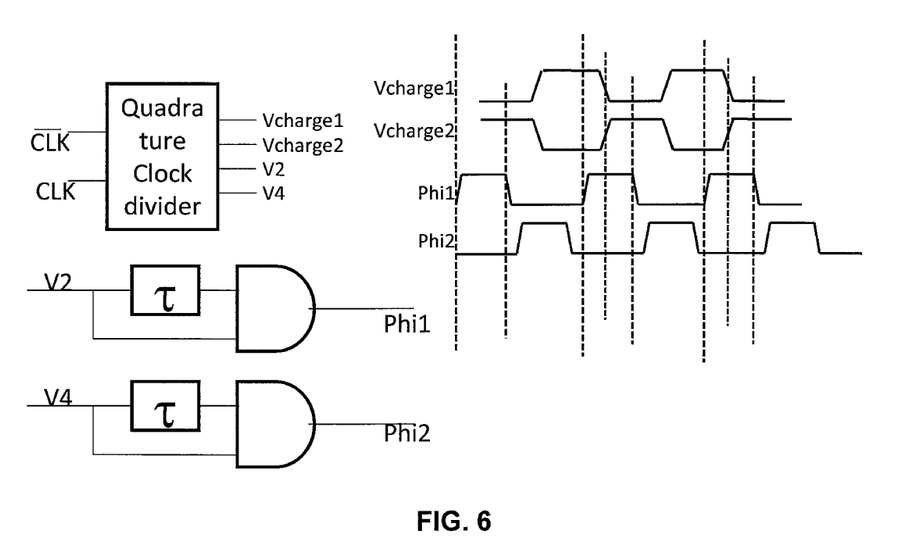
FIG. 6 shows a possible circuit implementation for the clock generator used in the system of FIG. 5.

FIG. 6 shows a possible circuit implementation for the clock generator. A quadrature clock divider can be used for generating four clock signals 25% phase shifted with respect to each other from a master clock CLK and its complement. As shown, two of these form the clock signals for switching Vcharge1 and Vcharge2 and two others V2 and V4 are used to generate the non-overlapping clock signals for the switches T1, T2. A delay ti is used together with an AND gate, wherein the delayed signal is combined with the original signal. The delay sets the duty cycle of the outputted signal Phi1, Phi2 (=Vset1, Vset2).

Figure 7:
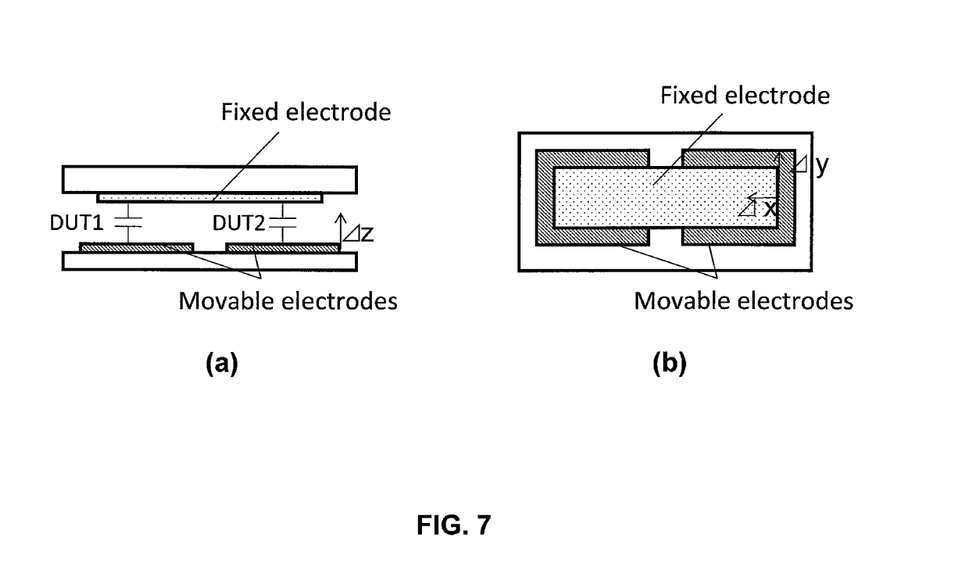

FIG. 7 shows an example of a MEMS application according to an embodiment of this disclosure, which can for example be used in a parallel-plate actuator (see for example Joseph I. Seeger et al., "Dynamics And Control Of Parallel-Plate Actuators Beyond The Electrostatic Instability," the 10th International Conference on Solid-State Sensors and Actuators, 1999, pp. 474-477) or a gyro sensor (see for example U.S. Pat. No. 5,353,656). The MEMS device has a fixed part carrying a fixed electrode and a movable part carrying first and second movable electrodes, which are thus movable with respect to the fixed electrode in one or more directions Δx, Δy, Δz. The fixed and first movable electrodes form a first capacitance DUT1 and the fixed and second movable electrodes form a second capacitance DUT2. By measuring mismatch of the capacitances with the method described herein, shifts of movable part can be detected.

The device can for example be a vibrational MEMS device which creates a base (specific frequency) electrical signal by detecting vibration of the movable part of the structure. In a gyro sensor, this can be used to detect an angular velocity.

The device can for example be used to control a position of an actuator by detecting shifts in the position of the movable part which is in this case connected to the actuator.

Figure 8:
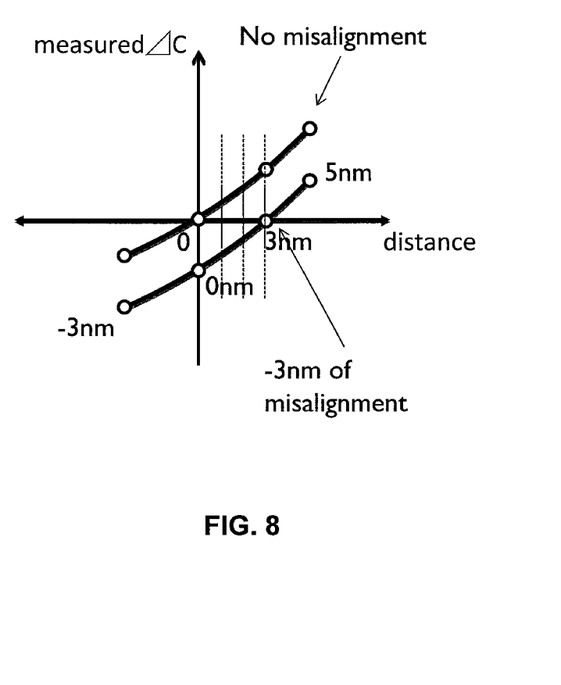
FIG. 8 shows a graph by means of which position information can be determined from a measured capacitance mismatch ΔC.

FIG. 8 illustrates a manner in which position information can be determined from a measured capacitance mismatch ΔC. Consider the structure of FIG. 3. The top curve on the plot of FIG. 8 is the ΔC signal we would measure when on silicon the lines are exactly printed as drawn on mask, i.e. alignment error is zero between the P and LI1 layer. By adding a set of alignment structures on the same substrate which are intentionally misaligned with different distances (e.g. −3n, 0n, 3n, 5n) we can extract the actual misalignment present on silicon. For example, if the printing of P (Poly) versus LI1 (Local interconnect 1) is misaligned −3n versus the mask (as drawn), the bottom curve is measured on the 0n structure which was intended (as drawn) to be perfectly aligned and a zero ΔC is measured on the 3n structure which was intended (as drawn) to be misaligned by 3n. The shift of the curve represents the alignment error. The alignment error can be read out where the ΔC curve crosses zero.

Figure 9:
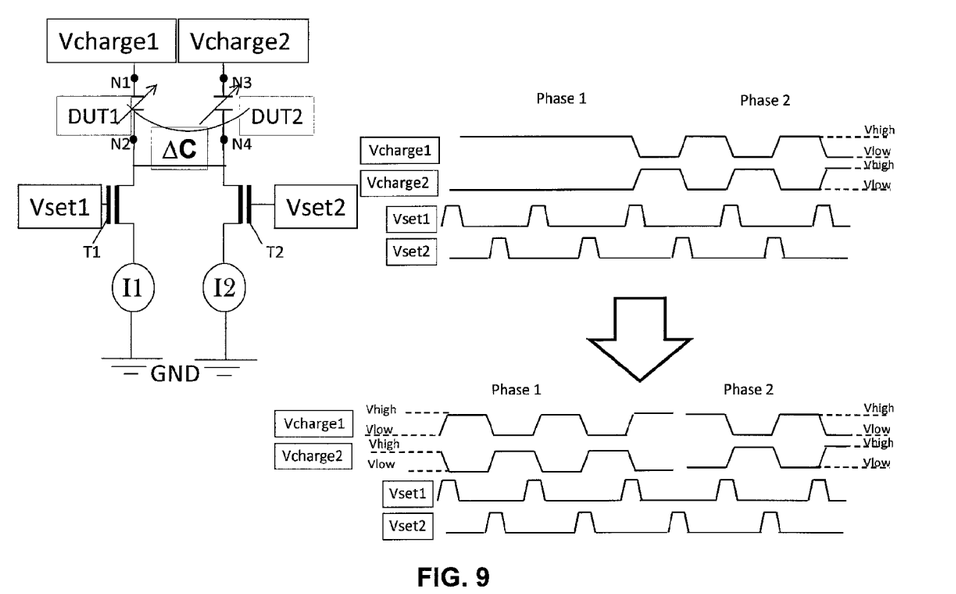
FIG. 9 shows an alternative embodiment of a test structure and its control according to the invention.

FIG. 9 shows an alternative embodiment of a method for measuring a capacitance difference (ΔC) between a first capacitive element (DUT1) and a second element (DUT2). The test structure is substantially the same as in the case of FIG. 1. The control is however different: the steady voltages applied in phase 1 of FIG. 2 are here replaced by alternating voltages, alternating between Vhigh and Vlow as in phase 2 but 180° inverted. In phase 2, the alternating voltages are the same or substantially the same as in phase 2 of FIG. 2. It has been found that with such waveforms or alternating voltages in phase 1, MOS capacitance mismatches can be measured more precisely. This is because these waveforms effectively double the VDD applied.

What is claimed is:

1. A method for measuring a capacitance difference (ΔC) between a first capacitive element (DUT1) and a second element (DUT2), the method comprising the steps of:
   providing a first DC voltage (Vhigh), a second DC voltage (Vlow) which is different from the first DC voltage, and a third DC voltage (GND);
   providing a measurement circuit comprising:
      a first switch (T1) and a second switch (T2) matched to the first switch (T1);
      a first node (N1) and a second node (N2) between which the first capacitive element (DUT1) is connectable, the second node (N2) being connectable to the third DC voltage (GND) via the first switch (T1);
      a third node (N3) and a fourth node (N4) between which the second capacitive element (DUT2) is connectable, the fourth node (N4) being connectable to the third DC voltage (GND) via the second switch (T2), and the second and fourth nodes (N2, N4) being connected to each other;
   connecting the first capacitive element (DUT1) between the first node (N1) and the second node (N2);
   connecting the second capacitive element (DUT2) between the third node (N3) and the fourth node (N4);
   in a first phase:
      applying the first DC voltage (Vhigh) to the first node (N1) and the second DC voltage (Vlow) to the third node (N3), to charge the capacitive elements (DUT1, DUT2);
      alternately closing the first and second switches (T1, T2) by use of non-overlapping clock signals (Vset1, Vset2) and measuring at least one of first resulting current (I1) and first resulting current (I2) flowing through first and second switches (T1, T2), respectively, the first resulting currents being proportional to the capacitance of the measurement circuit;
   in a second phase:
      applying the first and second DC voltages (Vhigh, Vlow) alternatingly to the first and third nodes (N1, N3), for alternatingly charging and discharging the capacitive elements (DUT1, DUT2);
      alternately closing the first and second switches (T1, T2) by use of the non-overlapping clock signals (Vset1, Vset2) at such instances that the alternations of the first and second DC voltages (Vhigh, Vlow) occur while either the first switch or the second switch is closed and measuring at least one of second resulting current (I1) and second resulting current (I2) flowing through the first and second switches (T1, T2), respectively, the second resulting currents being proportional to the capacitance of the measurement circuit together with the capacitance difference (ΔC); and
   determining the capacitance difference (ΔC) between the first and second capacitive element (DUT1, DUT2) by subtracting the first resulting current (I1) measured during the first phase from the second resulting current (I1) measuring during the second phase, or by subtracting the first resulting current (I2) measured during the first phase from the second resulting current (I2) measured during the second phase.

2. The method according to claim 1, wherein the first and second DC voltages (Vhigh, Vlow) are applied alternatingly to the first and third nodes (N1, N3) by alternately connecting the first node (N1) and the third node (N3) to a first DC voltage supply which supplies the first DC voltage and a second DC voltage supply which supplies the second DC voltage.

3. The method according to claim 1, wherein the first resulting currents and the second resulting currents are measured using a transimpedance amplifier.

4. The method according to claim 1, wherein the first resulting currents and the second resulting currents are measured using an integrator circuit.

5. The method according to claim 1, wherein the alternating of the first and second DC voltages is performed by complementary clock signals having a duty cycle of 50% and the non-overlapping clock signals (Vset1, Vset2) for operating the first and second switches (T1, T2) have a duty cycle of less than 50%.

6. The method according to claim 5, wherein the non-overlapping clock signals (Vset1, Vset2) have a duty cycle of more than 40%.

7. The method according to claim 1, wherein the third DC voltage is a ground voltage level (GND).

8. The method according to claim 1, wherein a first measurement is performed with the first, second and third DC voltages set to a first set of values and a second measurement is performed with the first, second and third DC voltages set to a second set of values different from the first set of values.

9. The method according to claim 1, wherein a first measurement is performed at a first frequency of the alternations and the non-overlapping clock signals and a second measurement is performed at a second frequency of the alternations and the non-overlapping clock signals, the second frequency being different from the first frequency.

10. The method according to claim 1, wherein in the first phase the first and second DC voltages (Vhigh, Vlow) are applied alternatingly to the first and third nodes (N1, N3) in an 180° inverted manner with respect to the second phase.

11. A method for measuring a position information between a first conducting material, a second conducting material and a third conducting material, wherein the first and second conducting materials form a first capacitive element and the second and third conducting materials form a second capacitive element, the method comprising a first step of measuring a capacitance difference between the first capacitive element and the second capacitive element using the method of claim 1 and a second step of determining the position information from the measured capacitance difference and material parameters of the first, second and third conducting materials.

12. A system for measuring a capacitance difference (ΔC) between a first capacitive element (DUT1) and a second capacitive element (DUT2), the system comprising the following components:
  means for supplying a first DC voltage (Vhigh), a second DC voltage (Vlow) which is different from the first DC voltage, and a third DC voltage (GND);
  a measurement circuit comprising:
    a first switch (T1) and a second switch (T2) matched to the first switch (T1);
    a first node (N1) and a second node (N2) between which the first capacitive element (DUT1) is connectable, the second node (N2) being connectable to the third DC voltage (GND) via the first switch (T1);
    a third node (N3) and a fourth node (N4) between which the second capacitive element (DUT2) is connectable, the fourth node (N4) being connectable to the third DC voltage (GND) via the second switch (T2), and the second and fourth nodes (N2, N4) being connected to each other;
  the voltage supply means being provided for applying in a first phase the first DC voltage (Vhigh) to the first node (N1) and the second DC voltage (Vlow) to the third node (N3), to charge the capacitive elements (DUT1, DUT2), and applying in a second phase the first and second DC voltages (Vhigh, Vlow) alternatingly to the first and third nodes (N1, N3), for alternatingly charging and discharging the capacitive elements (DUT1, DUT2);
  a controller provided for generating non-overlapping clock signals (Vset1, Vset2) for alternately closing the first and second switches (T1, T2) in the first and second phases, and for controlling the alternations of the first and second DC voltages (Vhigh, Vlow) in the second phase at such instances that these alternations occur while either the first switch or the second switch is closed, such that in the first phase first resulting currents (I1, I2) flow through at least one of the first and second switches (T1, T2), the first resulting currents being proportional to the capacitance of the measurement circuit, and that in the second phase second resulting currents (I1, I2) flow through at least one of the first and second switches (T1, T2), the second resulting currents being proportional to the capacitance of the measurement circuit together with the capacitance difference (ΔC);
  means for measuring at least one of the first resulting current (I1) and first resulting current (I2) flowing through the first and second switches (T1, T2), respectively, in the first phase and at least one of the second resulting currents (I1) and second resulting current (I2) flowing through the first and second switches (T1, T2), respectively, during the second phase; and
  means for determining the capacitance difference (ΔC) between the first and second capacitive element (DUT1, DUT2) by subtracting the first resulting current (I1) measured during the first phase from the second resulting current (I1) measuring during the second phase, or by subtracting the first resulting current (I2) measured during the first phase from the second resulting current (I2) measured during the second phase.

13. The system according to claim 12, wherein the voltage supply means comprises switches for alternately connecting the first node (N1) and the third node (N3) to a first DC voltage supply which supplies the first DC voltage and a second DC voltage supply which supplies the second DC voltage.

14. The system according to claim 12, wherein the measuring means for measuring the first resulting currents and the second resulting currents comprises a transimpedance amplifier.

15. The system according to claim 12, wherein the measuring means for measuring the first resulting currents and the second resulting currents comprises an integrator circuit.

16. The system according to claim 12, wherein the controller comprises a clock generator, provided for generating complementary clock signals having a duty cycle of 50% for the alternating of the first and second DC voltages and for generating the non-overlapping clock signals (Vset1, Vset2) with a duty cycle of less than 50% for operating the first and second switches (T1, T2).

17. The system according to claim 16, wherein the clock generator is provided for generating the non-overlapping clock signals (Vset1, Vset2) with a duty cycle of more than 40%.

18. The system according to claim 12, wherein the third DC voltage is a ground voltage level (GND).

19. The system according to claim 12, wherein the components are all fabricated on the same semiconductor substrate.

20. The system according to claim 12, wherein the voltage supply means is provided for applying in the first phase the first and second DC voltages (Vhigh, Vlow) alternatingly to the first and third nodes (N1, N3) in an 180° inverted manner with respect to the second phase.

21. A system for measuring a position information between a first conducting material, a second conducting material and a third conducting material, wherein the first and second conducting materials form a first capacitive element and the second and third conducting materials form a second capacitive element, the system comprising a first part which is a capacitance difference measurement system according to claim 12 for measuring a capacitance difference between the first capacitive element and the second capacitive element, and a second part provided for determining the position information from the measured capacitance difference and material parameters of the first, second and third conducting materials.

* * * * *